US010591319B2

(12) United States Patent
Teboulle

(10) Patent No.: US 10,591,319 B2
(45) Date of Patent: Mar. 17, 2020

(54) METHOD FOR COUNTING REVOLUTIONS OF A WHEEL

(71) Applicant: SAGEMCOM ENERGY & TELECOM SAS, Rueil-Malmaison (FR)

(72) Inventor: Henri Teboulle, Rueil-Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 10 days.

(21) Appl. No.: 16/071,809

(22) PCT Filed: Jan. 23, 2017

(86) PCT No.: PCT/EP2017/051285
§ 371 (c)(1),
(2) Date: Jul. 20, 2018

(87) PCT Pub. No.: WO2017/129508
PCT Pub. Date: Aug. 3, 2017

(65) Prior Publication Data
US 2019/0025093 A1    Jan. 24, 2019

(30) Foreign Application Priority Data

Jan. 25, 2016   (FR) ..................................... 16 50571

(51) Int. Cl.
*G01B 7/30*    (2006.01)
*G01D 5/244*    (2006.01)
(Continued)

(52) U.S. Cl.
CPC ........... *G01D 5/24461* (2013.01); *G01D 5/12* (2013.01); *G01D 5/14* (2013.01); *G01D 5/145* (2013.01);
(Continued)

(58) Field of Classification Search
CPC .................................................... G01D 5/145; G01D 5/14; G01D 5/12; G01D 11/245; G01B 7/30; G01B 7/003;
(Continued)

(56) References Cited

U.S. PATENT DOCUMENTS

| 2007/0140327 | A1* | 6/2007 | Yancey ................... H04L 7/007 375/227 |
| 2008/0033695 | A1* | 2/2008 | Sahara ................... G01H 1/003 702/185 |
| 2018/0328758 | A1* | 11/2018 | Teboulle ................. G01D 4/02 |

FOREIGN PATENT DOCUMENTS

| EP | 0 311 129 A1 | 4/1989 |
| EP | 0 408 084 A1 | 1/1991 |

OTHER PUBLICATIONS

"Low Energy Sensor AN0029—Application Note", EFM32, Sep. 16, 2013, pp. 1-23, Austin, Texas.

* cited by examiner

*Primary Examiner* — Raul J Rios Russo
(74) *Attorney, Agent, or Firm* — Muncy, Geissler, Olds & Lowe, P.C.

(57) ABSTRACT

The invention relates to a method for counting revolutions of a wheel (6) to which a target (7) is attached, the counting method comprising the step of: generating an oscillating signal representing the presence or the absence of the target (7); comparing an amplitude of the signal with a voltage threshold in order to obtain pulses (19); and detecting the presence of the target (7) or the absence of the target on the basis of the number of pulses obtained. The method also comprises a step of detecting a disruption which is implemented as feedback and which consists in acquiring differential pulse values each equal to a difference between two numbers of pulses obtained during two consecutive detection intervals, and in detecting a disruption upon identifying (Continued)

an erroneous sequence of consecutive differential pulses. A consumption meter and a computer program corresponding to the method and means for storing such a program are also claimed.

14 Claims, 3 Drawing Sheets

(51) Int. Cl.
| | |
|---|---|
| *G01D 5/20* | (2006.01) |
| *G01D 5/14* | (2006.01) |
| *G01D 11/24* | (2006.01) |
| *G01D 5/12* | (2006.01) |
| *G01R 33/00* | (2006.01) |
| *G01R 33/09* | (2006.01) |
| *G01B 7/14* | (2006.01) |
| *G01B 7/00* | (2006.01) |

(52) U.S. Cl.
CPC ........... *G01D 5/202* (2013.01); *G01D 11/245* (2013.01); *G01R 33/0023* (2013.01); *G01R 33/0052* (2013.01); *G01R 33/09* (2013.01); *G01B 7/003* (2013.01); *G01B 7/14* (2013.01); *G01B 7/30* (2013.01)

(58) Field of Classification Search
CPC ........ G01B 7/14; G01B 11/026; G01R 33/09; G01R 33/0023; G01R 33/0052; G01R 33/093
USPC .................. 324/51, 55, 200, 207.11, 207.25
See application file for complete search history.

METHOD FOR COUNTING REVOLUTIONS OF A WHEEL

The present invention relates to counting revolutions of a wheel, e.g. in the field of mechanical meters such as those used for distributing gas or water.

BACKGROUND OF THE INVENTION

A gas meter is known that has a wheel rotating about an axis relative to a structure in such a manner that the speed of rotation of the wheel is representative of the quantity of gas distributed.

The gas meter has a device for counting the number of revolutions of the wheel. The counter device comprises a target, a target detector device, and a counter unit.

A counter device is thus known in which the target is an off-center magnet fastened to the wheel, and in which the detector device comprises a magnetic relay of the reed bulb type that is mounted stationary relative to the structure. The counter unit is connected to the magnetic relay in order to detect the passage of the magnet and thus count the number of revolutions.

A counter device is also known in which the target is a piece of metal, and in which the detector device comprises a coil of a resonant circuit. The counter unit is then connected to the resonant circuit in order to detect the passage of the piece of metal and thus count the number of revolutions.

The design of such a counter device needs to comply with requirements that are very strict in terms of counting accuracy. The acceptable amount of drift that is specified for certain modern gas meters is thus typically less than or equal to one revolution for every ten thousand revolutions.

Unfortunately, the gas meter wheel and the target detector device are subjected to multiple constraints that tend to disturb counting: mechanical drift, e.g. due to vibration, to wear phenomena causing the wheel to warp, to components aging, to temperature variations, etc.

The counter unit of the counter device is also subjected to multiple constraints. The electrical components of the counter unit are in particular subjected to radiofrequency disturbances and to disturbances on the power supply.

Radiofrequency disturbances result in particular from radio waves being transmitted by the gas meter or in the environment of the gas meter in order to transmit data by wireless communication. By way of example, the transmitted data may be data concerning the quantity of gas distributed. By way of example, the wireless communication may be of the radiofrequency identification (RFD) type or of the near field communication (NFC) type.

Power supply disturbances result in particular from transient inrush currents that can occur each time the counter unit starts (since it is kept on standby for most of the time), where such an inrush current causes a drop in the power supply voltage that is of short duration, but relatively significant.

These constraints and disturbances together tend to reduce the counting accuracy.

OBJECT OF THE INVENTION

An object of the invention is to improve the accuracy with which revolutions of a wheel are counted, but without that significantly increasing the cost or the complexity of performing said counting.

SUMMARY OF THE INVENTION

In order to achieve this object, there is provided a counting method for counting revolutions of a wheel on which a target is secured, the counting method comprising the following steps repeated at regular detection intervals:
  generating an oscillating voltage signal representative of the presence or the absence of the target;
  comparing an amplitude of the oscillating voltage signal with a predetermined voltage threshold in order to obtain pulses; and
  detecting presence of the target or absence of the target as a function of the number of pulses obtained.

According to the invention, the counting method further comprises a step of detecting a disturbance that might affect detection of the target, the detection step being performed retroactively and consisting in acquiring differential pulse values each equal to a difference between two numbers of pulses obtained during two successive detection intervals, and in detecting a disturbance by identifying an erroneous sequence of successive differential pulses.

Detecting disturbances that might affect detection of the target makes it possible to correct the number of pulses obtained during such disturbances and thus to improve detection of the target and counting accuracy.

The counting method of the invention thus improves counting accuracy by correcting the effect of the disturbances by analyzing data that is available (the values of the differential pulses), and it does not require additional hardware components to be added in order to improve the accuracy of target detection. The complexity and the cost of performing the counting method of the invention are thus reduced.

Other characteristics and advantages of the invention appear on reading the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figure 1:
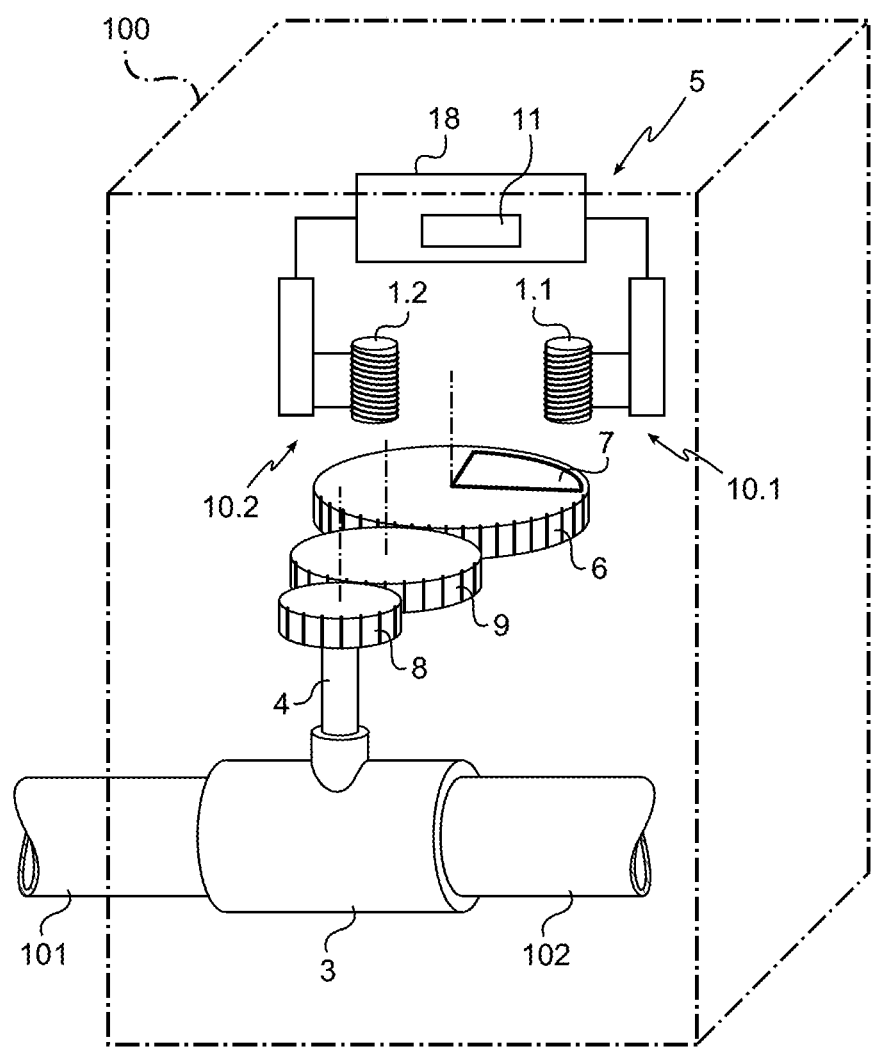
FIG. 1 is a diagrammatic perspective view of a gas meter that performs the method of the invention for counting revolutions of a wheel.
Figure 2:
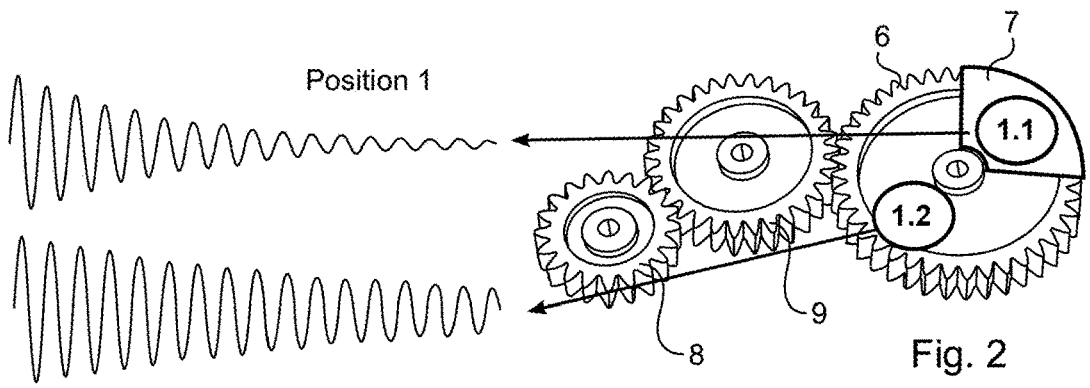
FIG. 2 shows the wheel in a certain position, together with the appearance of an oscillating voltage signal produced by the inductive circuits of a counter device of the meter.
Figure 3:
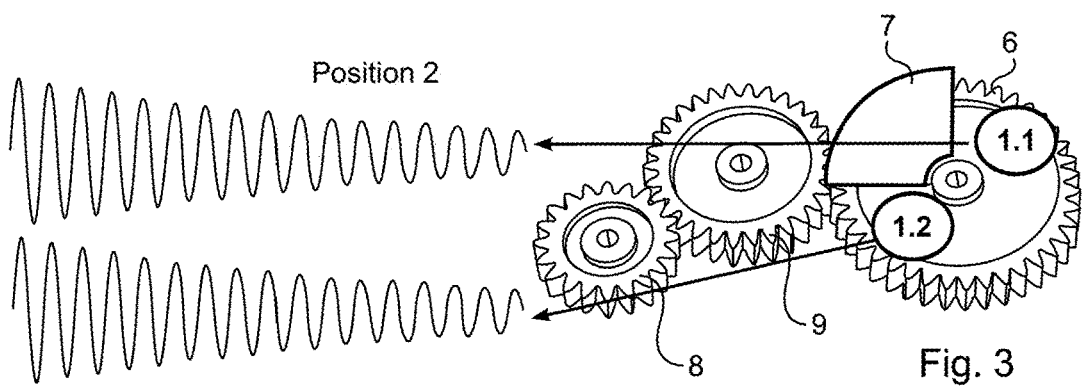
FIGS. 3 to 5 are views analogous to FIG. 2, for other positions of the wheel.
Figure 4:
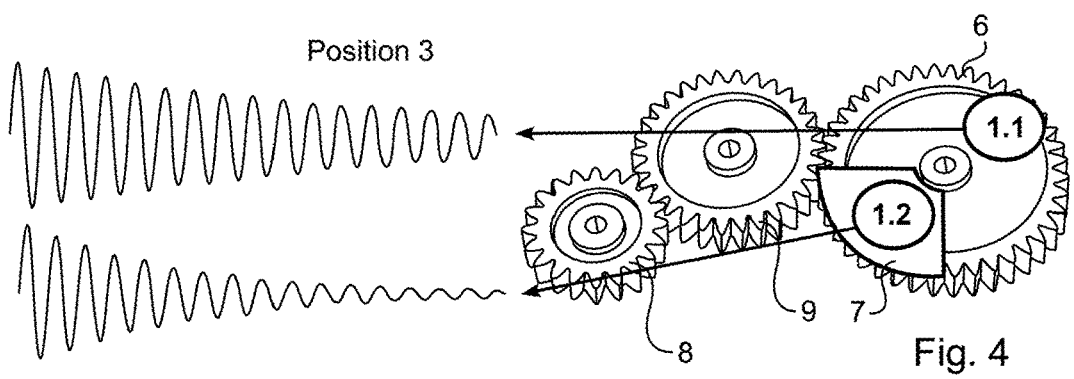
Figure 5:
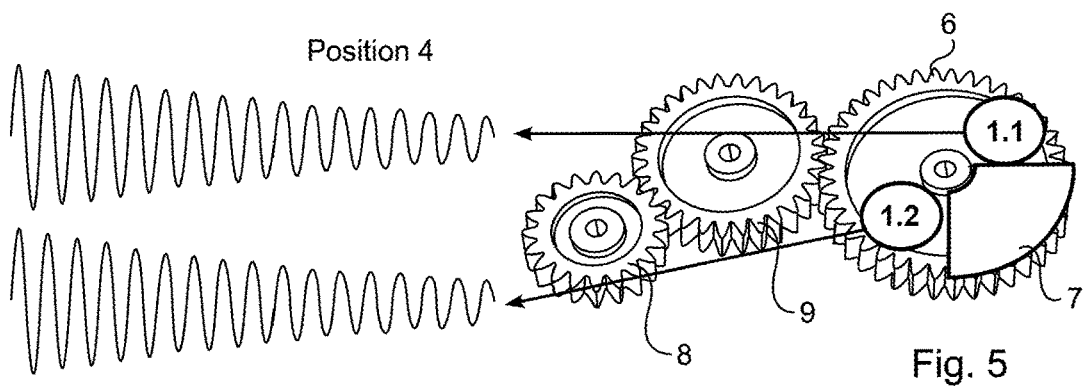

The invention is described below in application to a gas meter for installing in a private building for connecting a gas distribution installation in the building to an external gas distribution network. Naturally, the invention is not limited to this particular application, and in particular it also applies to meters for water, electricity, . . . .

With reference to FIGS. 1 to 5, the gas meter comprises a structure forming a box 100 at which there arrives a gas feed pipe 101 that is connected to the external distribution network, and from which there leaves a pipe 102 of the gas distribution installation. The two pipes are connected together by a coupling 3 in which there extends a portion of a rotary element 4 that is driven in rotation by the gas flowing through the coupling from the pipe 101 towards the pipe 102 in such a manner that rotation of the rotary element 4 is representative of the quantity of gas passing through the coupling 3.

A wheel 6 made of non-metallic material is constrained to rotate with the rotary element 4. The wheel 6 has peripheral teeth and a first gearwheel 8 is secured to the rotary element 4 in order to transmit the motion of the rotary element 4 to the wheel 6 via a second gearwheel 9 meshing both with the wheel 6 and also with the first gearwheel 8. The gearwheels 8 and 9, and the wheel 6 are of diameters such that the wheel 6 presents a frequency of rotation that is lower than the frequency of rotation of the first gearwheel 8. In this example, the wheel 6 rotates at half the speed of the first gearwheel 8.

The gas meter has a counter device for counting revolutions of the wheel 6 and given overall reference 5.

The counter device 5 comprises firstly a target 7, which is an off-center metal mass positioned on the wheel 6. In this example, the target 7 occupies one-fourth of the wheel 6.

The counter device 5 also has a first detector device comprising a first resonant inductive circuit 10.1 and a second detector device comprising a second resonant inductive circuit 10.2.

The counter device 5 also has a counter unit 18 that comprises a microcontroller 11 in this example. The first resonant inductive circuit 10.1 and the second resonant inductive circuit 10.2 are connected to the counter unit 18.

Each resonant inductive circuit 10.1, 10.2 comprises a coil 1.1, 1.2 that is mounted stationary relative to the box 100, each facing a respective portion of the path followed by the target 7. The coils 1.1 and 1.2 are spaced apart from each other so that each coil 1 senses the target 7 in succession, i.e. when one of the coils 1.1, 1.2 is subjected to the influence of the target 7, the other one of the coils 1.1 and 1.2 is not.

Figure 6:
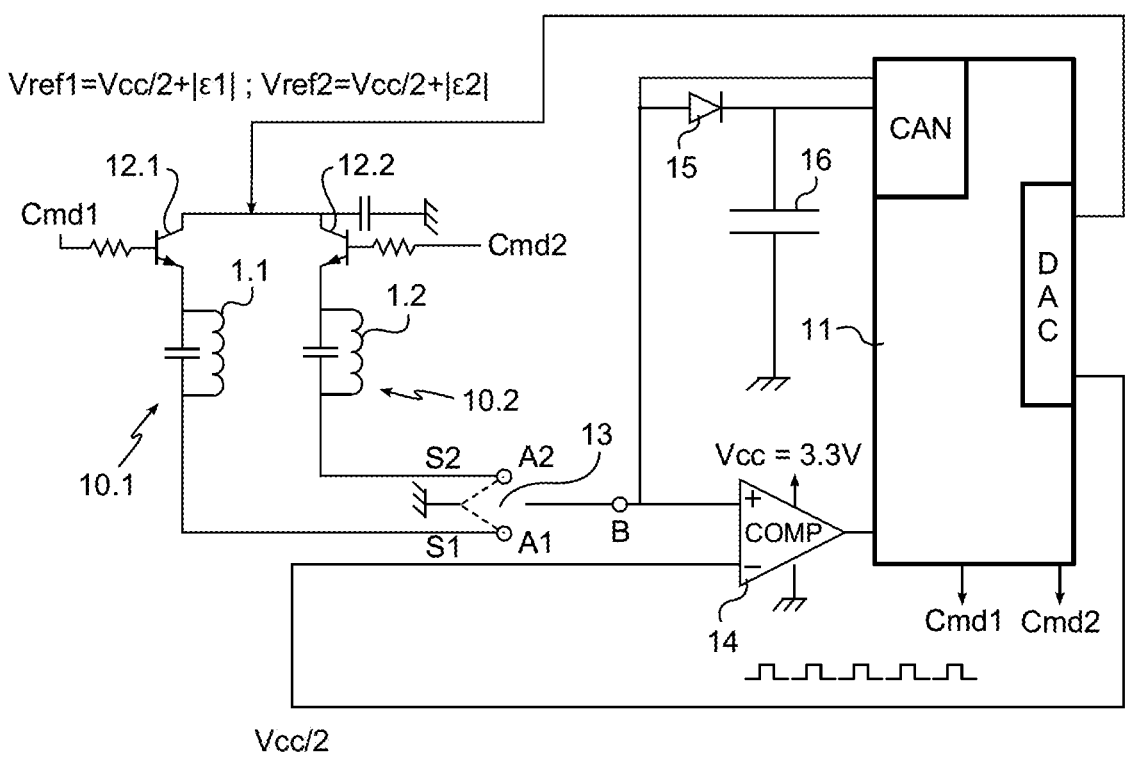
FIG. 6 is a circuit diagram of the counter device.

With reference to FIG. 6, each coil 1 has a top end connected to an analog-to-digital converter ADC of the microcontroller 11 via switches 12.1, 12.2 and a bottom end connected to a terminal A1, A2 of a switch 13 having a third terminal connected to ground and a fourth terminal B connected to a non-inverting input of a comparator 14. The comparator 14 has an inverting input connected to the digital-to-analog converter DAC of the microcontroller 11 and an output connected to an input of the microcontroller 11. The microcontroller 11 includes a mechanism enabling rising fronts to be counted in the output from the comparator 14 (it would be equally possible to count falling fronts instead of rising fronts). The waveform of the signal output by the comparator 14 is a squarewave pulse signal, e.g. at 3.3 volts (V).

The terminal B of the switch 13 is connected via a diode 15 to an analog-to-digital converter ADC of the microcontroller 11. A capacitor 16 is connected between the cathode of the diode 15 and ground in order to form a detector for detecting the envelope of the signal arriving via the terminal B of the switch 13.

The microcontroller 11 controls the transistors 12.1 and 12.2 to switch between their conductive and non-conductive states by means of control signals Cmd1, Cmd2.

Figure 7:
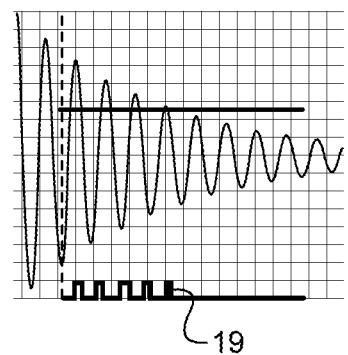
FIG. 7 is a graph plotting a curve of an oscillating voltage signal together with the pulses that are generated from the oscillating voltage signal while detecting the presence of a target situated on the wheel.
Figure 8:
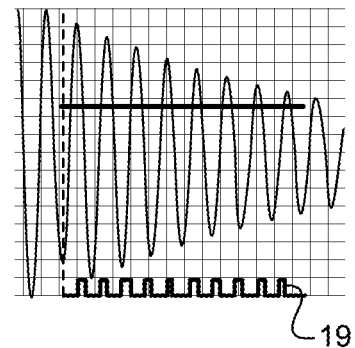
FIG. 8 is a figure analogous to FIG. 7, but while detecting the absence of the target.

The counter unit 18 is arranged to perform the counting method of the invention, which comprises the following steps, repeated at regular detection intervals:
transmitting respective voltage pulses Vref1 and Vref2 almost simultaneously to the inputs of each of the inductive circuits 10.1, 10.2, the voltage pulses being of predetermined amplitude so as to generate respective oscillating voltage signals S1, S2 at the outputs from the inductive circuits 10.1, 10.2;
detecting the oscillating voltage signals S1, S2 at the outputs of the inductive circuits 10.1, 10.2 and comparing the amplitude of each oscillating voltage signals S1, S2 with a predetermined voltage threshold Vcc/2;
detecting presence of the target 7 when the number of pulses obtained is less than or equal to a predetermined low threshold (as shown in FIG. 7), and detecting absence of the target 7 when the number of pulses obtained is greater than or equal to a predetermined high threshold (as shown in FIG. 8); and
incrementing a stored number of revolutions by one after the presence of the target 7 has been detected twice in succession.

It can be understood that each inductive circuit 10.1, 10.2 damps the voltage pulse and delivers an oscillating voltage signal. Depending on whether or not the target 7 is present under the coil 1.1, 1.2, the damping provided by each inductive circuit 10.1, 10.2 is modified.

The voltage pulse Vref1, Vref2 is transmitted to the input of each inductive circuit 10.1, 10.2 as follows.

The transistors 12.1, 12.2 are initially in the non-conductive state and the switch 13 connects both coils 1.1, 1.2 to ground.

At an instant t=tn, the coil 1.1 is excited by injecting the voltage pulse Vref1. For this purpose, the transistor 12.1 is switched to its conductive state and, after 2 microseconds (μs) (the capacitance of the coil 1.1 is then charged), the switch 13 is operated to connect the coil 1.1 to the positive input of the comparator 14 so as to deliver the signal S1 thereto. At t=tn+t0, the number of pulses is determined.

When the coil 1.1 is excited, the coil 1.2 is decoupled as much as possible from the remainder of the first counter device. The bottom end of the coil 1.2 is grounded for this purpose via the switch 13, and the top end of the coil 1.2 is taken to a high impedance via the switch 12.2.

At the instant t=tn+50 μs, the coil 1.2 is excited by injecting the voltage pulse Vref2. For this purpose, the transistor 12.2 is switched to its conductive state and, after 2 μs (the capacitance of the coil 1.2 is then charged), the switch 13 is operated to connect the coil 1.2 to the positive input of the comparator 14 and to deliver the signal S2 thereto. At t=tn+50 μs+t0, the number of pulses is determined.

When the coil 1.2 is excited, the coil 1.1 is decoupled as much as possible from the remainder of the first counter device. The bottom end of the coil 1.1 is grounded for this purpose via the switch 13, and the top end of the coil 1.1 is taken to high impedance via the switch 12.1.

The predetermined high threshold for the number of pulses obtained making it possible to detect absence of the target is equal to 17 in this example, and the predetermined low threshold for the number of pulses obtained serving to detect the presence of the target is equal to 14 in this example.

The respective voltages of the pulses Vref1 and Vref2 are adjusted beforehand (e.g. in the factory), so as to be slightly greater than the predetermined voltage threshold Vcc/2, and in this example they are equal respectively to Vcc/2+|ε1| and Vcc/2+|ε2|. This adjustment makes it possible to set the nominal number of pulses that are obtained in the presence and in the absence of the target 7 under nominal conditions of fabrication and of operation (conditions concerning temperature, etc.).

In this example, the adjustment is performed in such a manner that the nominal number of pulses that are obtained is equal to 11 when presence of the target is detected, and to 20 when absence of the target is detected.

It should be observed that for each detector device and for each detection interval, when the number of pulses obtained is greater than 17 (i.e. greater than the predetermined high threshold), then the number of pulses obtained is "artificially" forced to 17, and when the number of pulses obtained is less than 14 (i.e. the predetermined low threshold), the number of pulses obtained is artificially forced to 14. This simplifies counting revolutions by limiting variations in the number of pulses obtained.

In this example, the regular detection intervals are equal to 143 milliseconds (ms), which corresponds to a sampling frequency of 7 hertz (Hz).

As mentioned above, a certain number of constraints and disturbances might affect detection of the target 7, and thus the counting of revolutions of the wheel 6.

Among these disturbances, some disturbances have the effect of increasing or of reducing the amplitude of the oscillating voltage signal output by each inductive circuit 10.1, 10.2.

This applies for example to "mechanical" disturbances, which tend to deform the wheel 6, and which cause the coils 1.1, 1.2 to be further away from or closer to the wheel 6 and thus the target 7.

This also applies most particularly to power supply disturbances, which lead to an increase or a reduction in the power supply voltage of the counter unit 18. The impact of such an increase or decrease in the power supply is particularly important concerning the respective voltages of the pulses Vref1 and Vref2 (and thus concerning the amplitudes of the oscillating voltage signals) and also concerning the predetermined voltage threshold Vcc/2.

In the two example disturbances mentioned above, the number of pulses obtained at the output from the comparator 14 becomes modified compared with what it would have been in the absence of the disturbances. There therefore exists a risk of detecting absence of the target 7 even though it is present, or presence of the target 7 even though it is absent, and thus of counting a revolution of the wheel 6 when it has not revolved (or at least when the wheel 6 has not performed one complete revolution). Naturally, such a situation is not acceptable for a consumer for whom measured gas consumption might increase even though there was no increase in reality.

The counting method of the invention includes a step of detecting such a disturbance.

For each detector device considered independently, and thus for each coil 1.1, 1.2 considered independently, the detection step consists in acquiring differential pulse values, each equal to the difference between two numbers of pulses obtained during two successive detection intervals, and in detecting a disturbance on the basis of identifying an erroneous sequence of successive differential pulses.

The analyzed sequences of successive differential pulses are of a length lying between a first predetermined minimum length and a first predetermined maximum length (i.e. each analyzed sequence has a number of successive differential pulses that is at least equal to the first predetermined minimum length and a number of successive differential pulses that is at most equal to the first predetermined maximum length). In this example, the first predetermined minimum length is equal to 2 and the first predetermined maximum length is equal to 9.

The concept of "successive differential pulses" is illustrated by using three examples of sequences of numbers of pulses produced by one of the detector devices (and thus one of the coils 1.1, 1.2).

The following sequence of numbers of pulses:
. . . /17/16/16/17/17/17/17/ . . .
corresponds for, a given detector device and coil 1, to obtaining 17 pulses during one detection interval, followed by 16 pulses during two detection intervals, then 17 pulses during four detection intervals, each detection interval having a duration of 143 ms. Absence of the target 7 is thus detected during seven 143 ms detection intervals.

The corresponding sequence of successive differential pulses is as follows:
. . . /−1/0/1/0/0/0/ . . .
which, to simplify, is written herein as −1/0/1/0/0/0.

Likewise, the following sequence of numbers of pulses:
14/14/14/15/14/14/14
corresponds, for a given detector device and coil 1, to obtaining 14 pulses during three detection intervals, followed by 15 pulses during one detection interval, then 14 pulses during three detection intervals, each detection interval having a duration of 143 ms. The presence of the target 7 is thus detected during seven 143 ms detection intervals.

The corresponding sequence of successive differential pulses is as follows:
0/0/1/−1/0/0.

The following sequence of numbers of pulses:
14/14/15/16/17/17/17
corresponds, for a given detector device and coil 1, to obtaining 14 pulses during two detection intervals, then 15 pulses during one detection interval, then 16 pulses during one detection interval, then 17 detection pulses during three detection intervals, each detection interval having a duration of 143 ms.

The presence followed by the absence of the target 7 are thus detected, which means that the wheel 6 has revolved.

The corresponding sequence of successive differential pulses is as follows:
0/1/1/1/0/0.

The sequences described above are valid sequences of numbers of pulses and of successive differential pulses.

Examples of erroneous sequences of successive differential pulses are described below.

Thus, the following sequence is a first erroneous sequence of successive differential pulses:
−1/2/0/−1.

The successive differential pulses in the first erroneous sequence of successive differential pulses were obtained at the following respective times:
8787.286 s;
8787.429 s;
8787.571 s;
8787.714 s.

Differential pulses outside the first erroneous sequence of successive differential pulses and adjacent to the bounds of the first erroneous sequence of successive differential pulses were zero (i.e. a differential pulse equal to 0 was obtained at time 8787.143 s and a differential pulse equal to 0 was obtained at time 8787.857 s).

It should be observed that the time interval between two successive differential pulses is indeed equal to one detection interval, i.e. 143 ms.

The first erroneous sequence of successive differential pulses results from a drop in the amplitude of the oscillating voltage signal output by the inductive circuit 10 and thus to obtaining an erroneous number of pulses, said erroneous number of pulses that are obtained producing erroneous differential pulse values.

Likewise, the following sequence is a second erroneous sequence of successive differential pulses:
−2/2.

The successive differential pulses of the second erroneous sequence of successive differential pulses were obtained at the following times:
17637.857 s;
17638.000 s.

Differential pulses outside the second erroneous sequence of successive differential pulses and adjacent to the bounds of the second erroneous sequence of successive differential pulses were zero (i.e. a differential pulse equal to 0 was obtained at time 17637.714 s, and a differential pulse equal to 0 was obtained at time 17638.143 s).

Likewise, the following sequence is a third erroneous sequence of successive differential pulses:
−1/1/1/−1/1/−2/1/1/−1.

The successive differential pulses of the third erroneous sequence of successive differential pulses were obtained at the following times:
19873.429 s;
19873.571 s;
19873.714 s;
19873.857 s;
19874.000 s;
19874.143 s;
19874.286 s;
19874.429 s;
19874.571 s.

It should be observed that the differential pulses outside the third erroneous sequence of successive differential pulses and adjacent to the bounds of the third erroneous sequence of successive differential pulses were zero (i.e. a differential pulse equal to 0 was obtained at time 19873.286 ms and a differential pulse equal to 0 was obtained at time 19874.714 s).

Identifying an erroneous sequence of successive differential pulses performed as follows.

A given sequence of successive differential pulses is identified as being an erroneous sequence if:
the sum of the values of the differential pulses making up the given sequence is zero; and
the bounds of the given sequence are not zero; and
the differential pulses outside the sequence in question and adjacent to the bounds of the given sequence are zero.

Alternatively, a given sequence of successive differential pulses is considered to be erroneous if, in addition to the above criteria, the given sequence of successive differential pulses includes at most one differential pulse of value zero.

The above first, second, and third erroneous sequences of successive differential pulses do indeed satisfy the specified criteria.

The counting method of the invention also includes a step of detecting actual turning, making it possible to detect actual turning of the wheel 6 within the erroneous sequence of successive differential pulses. It is naturally indeed possible that the wheel 6 is rotating when a disturbance occurs.

The step of detecting actual turning is performed in this example only on erroneous sequences of successive differential pulses of length greater than or equal to a second predetermined minimum length. In this example, the second predetermined minimum length is equal to 4.

It should be observed at this point that when an erroneous sequence of successive differential pulses of length shorter than the second predetermined minimum length is detected, the step of detecting actual turning is not performed and all of the differential pulses of the erroneous sequence are set to zero. The corresponding sequence of numbers of pulses obtained is then used for counting revolutions of the wheel 6.

The step of detecting actual turning for the erroneous sequence of successive differential pulses consists in:
classifying differential pulses having an absolute value that is greater than or equal to a first predetermined threshold value in a first category;
classifying differential pulses having an absolute value that is greater than or equal to a second predetermined threshold value, where the second predetermined threshold value is less than the first predetermined threshold value, in a second category;
classifying differential pulses having an absolute value that is less than or equal to a third predetermined threshold value, where the third predetermined threshold value is less than the second predetermined threshold value, in a third category; and
from among the differential pulses in the first category and in the second category, identifying valid differential pulses, which are pulses of opposite signs that are separated in the erroneous sequence by at least two successive differential pulses.

In this example, the first predetermined threshold value is equal to 3, the second predetermined threshold value is equal to 2, and the third predetermined threshold value is equal to 1.

Thereafter, the valid differential pulses of the erroneous sequence of successive differential pulses are set to a predetermined differential value, and the other differential pulses of the erroneous sequence of successive differential pulses are set to zero.

The predetermined differential value is positive when the valid differential pulse of the erroneous sequence is positive and the predetermined differential value is negative when the valid differential pulses of the erroneous sequence is negative.

In this example, the positive predetermined differential value is equal to 2 and the negative predetermined differential value is equal to −2.

In order to illustrate the step of detecting actual turning, reference is made again to the first, second, and third erroneous sequences of successive differential pulses, and attention is given to the forms of these erroneous sequences of successive differential pulses when actual turning occurs during each of these erroneous sequences of successive differential pulses.

In the first erroneous sequence of successive differential pulses, actual turning gives rise to a modification to the first erroneous sequence of successive differential pulses:
−1/2/0/−1
that becomes, as a result of the actual turning, a fourth erroneous sequence of successive differential pulses:
−2/−2/2/2.

None of the differential pulses is classified in the first category (since none of the differential pulses possesses an absolute value greater than or equal to 3). The first, second, third, and fourth differential pulses (having respective values −2, −2, 2, and 2) are classified in the second category. None of the differential pulses is classified in the third category.

Thereafter, in the second category, valid differential pulses are identified, i.e. pulses that are of opposite signs and that are separated in the erroneous sequence by at least two successive differential pulses. This applies to the first differential pulse and to the fourth differential pulse.

These valid differential pulses correspond to actual turning of the wheel 6 superposed on a disturbance. It is thus pertinent to take them into account when counting revolutions of the wheel 6.

The valid differential pulses of the fourth erroneous sequence of differential pulses are set to the appropriate predetermined differential value: the first differential pulse takes the value −2 and the fourth differential pulse takes the value 2. The other differential pulses of the fourth erroneous sequence of successive differential pulses are set to zero.

The fourth erroneous sequence of successive differential pulses thus becomes:
−2/0/0/2.

The −2 differential pulse corresponds to the transition between detecting absence and detecting presence of the target 7 of the wheel 6, and thus to actual turning of the wheel 6. Likewise, the 2 differential pulse corresponds to the transition between detecting presence and detecting absence of the target 7 of the wheel 6, and thus to actual turning of the wheel 6.

In the second erroneous sequence of successive differential pulses, actual turning is represented by a modification of the second erroneous sequence of successive differential pulses:
(0)/−2/2/(0)
which, because of the actual turning, becomes a fifth erroneous sequence of successive differential pulses:
−4/0/2/2.

It may be observed that the actual turning also has an impact on the differential pulses outside the sequence and adjacent to the bounds of the sequence.

The first differential pulse (starting from the left, of value −4) is classified in the first category. The third and the fourth differential pulses (of values 2 and 2) are classified in the second category. The second differential pulse (of value 0) is classified in the third category.

Thereafter, in the first category and in the second category, valid pulses are identified, i.e. pulses of opposite signs and that are separated, in the erroneous sequence, by at least two successive differential pulses. This applies to the first differential pulse and to the fourth differential pulse.

These valid differential pulses correspond to actual turning of the wheel 6 superposed on a disturbance. It is therefore pertinent to take them into account when counting the revolutions of the wheel 6.

The valid differential pulses of the fifth erroneous sequence of successive differential pulses are set to the appropriate predetermined differential values: the first differential pulse takes the value −2 and the fourth differential pulse takes the value 2. The other differential pulses of the fifth erroneous sequence of successive differential pulses are set to zero.

The fifth erroneous sequence of successive differential pulses thus becomes:
−2/0/0/2.

The −2 differential pulse corresponds to the transition between detecting absence and detecting presence of the target 7 of the wheel 6, and thus to actual turning of the wheel 6. Likewise, the 2 differential pulse corresponds to the transition between the detecting presence and detecting absence of the target 7 of the wheel 6, and thus to actual turning of the wheel 6.

In the third erroneous sequence of successive differential pulses, actual turning gives rise to a modification of the third erroneous sequence of successive differential pulses:
−1/1/1/−1/1/−2/1/1/−1,
which, because of the actual turning, becomes a sixth erroneous sequence of successive differential pulses:
−1/1/−3/1/1/−2/3/1/−1.

The third differential pulse (starting from the left; of value −3) and the seventh differential pulse (the value 3) are classified in the first category. The sixth differential pulse (of value −2) is classified in the second category. The first, second, fourth, fifth, eighth, and ninth differential pulses (of respective values −1, 1, 1, 1, 1, −1) are classified in the third category.

Thereafter, in the first category and in the second category, valid pulses are identified, i.e. pulses of opposite signs and that are separated in the erroneous sequence by at least two successive differential pulses. This applies to the third differential pulse and to the seventh differential pulse.

These valid differential pulses correspond to actual turning of the wheel 6 superposed on a disturbance. It is thus pertinent to take them into account for counting revolutions of the wheel 6.

The valid differential pulses of the sixth erroneous sequence of successive differential pulses are set to the predetermined value: the third differential pulse takes the value −2 and the seventh differential pulse takes the value 2. The other differential pulses of the erroneous sequence are set to zero.

The sixth erroneous sequence of successive differential pulses thus becomes:
0/0/−2/0/0/0/2/0/0.

It should be observed that the step of detecting disturbance and the step of detecting actual turning are performed retroactively. Detecting a disturbance and detecting actual turning consists in effect in identifying particular erroneous sequences of successive differential pulses that result from numbers of pulses obtained during detection intervals that precede said detection.

This thus constitutes non-linear filtering by correlation with retroactive effect, that makes it possible retroactively to eliminate the potentially harmful effects of disturbances on counting revolutions of the wheel 6.

Since the counting information is typically returned twice a day by the gas meter, performing this retroactive effect filtering does not lead to any delay in transmitting counting information (and thus gas consumption data).

It is possible to make provision for performing the actual turning detection step only when a speed of rotation of the wheel 6 is greater than a predetermined speed threshold. Typically, the predetermined speed threshold is equal to 0.5 revolutions per second. Specifically, when the wheel 6 is rotating at a relatively high speed, it is much more probable that actual turning can be detected in the event of a disturbance occurring. This applies for example when the wheel 6 is rotating at a speed of 1.2 revolutions per second.

Under such circumstances, when the step of detecting actual turning is not performed, all of the differential pulses of the erroneous sequence of successive differential pulses are set to zero.

Naturally, the invention is not limited to the implementation described, but covers any variant coming within the ambit of the invention as defined by the claims.

The numerical values and thresholds used in the description are provided solely to illustrate the invention and they may naturally be different.

The additional step of detecting actual turning is naturally advantageous, but not essential. Specifically, it is perfectly possible to make provision, in the event of an erroneous sequence of successive differential pulses being identified, for all of the values of the differential pulses of the erroneous sequence of successive differential pulses to be set to zero, and for this to be done regardless of the length of said sequence.

The invention claimed is:

1. A counting method for counting revolutions of a wheel on which a target is secured, the counting method comprising the following steps repeated at regular detection intervals:
    generating an oscillating voltage signal representative of the presence or the absence of the target;
    comparing an amplitude of the oscillating voltage signal with a predetermined voltage threshold (Vcc/2) in order to obtain pulses; and
    detecting presence of the target or absence of the target as a function of the number of pulses obtained,
    the counting method being characterized in that it further comprises a step of detecting a disturbance that might affect detection of the target, the detection step being performed retroactively and consisting in acquiring differential pulse values, each equal to a difference between two numbers of pulses obtained during two successive detection intervals, and in detecting a disturbance by identifying an erroneous sequence of successive differential pulses.

2. The counting method according to claim 1, wherein a given sequence is identified as being an erroneous sequence of successive differential pulses when:
    the sum of the values of differential pulses constituting the given sequence is zero; and
    bounds of the given sequence are not zero; and
    differential pulses outside the given sequence and adjacent to the bounds of the given sequence are zero.

3. The counting method according to claim 2, wherein a given sequence is identified as being an erroneous sequence of successive differential pulses only if the given sequence has at most one zero differential pulse.

4. The counting method according to claim 1, wherein, when an erroneous sequence of successive differential pulses is identified, the values of the differential pulses of the erroneous sequence of successive differential pulses are set to zero.

5. The counting method according to claim 1, further comprising a step of detecting actual turning, which step consists in detecting actual turning of the wheel by analyzing the erroneous sequence of successive differential pulses.

6. The counting method according to claim 5, wherein, for a given erroneous sequence of successive differential pulses, the step of detecting actual turning consists in:
    classifying differential pulses having an absolute value that is greater than or equal to a first predetermined threshold value in a first category;
    classifying differential pulses having an absolute value that is greater than or equal to a second predetermined threshold value, when the second predetermined threshold value is less than the first predetermined threshold value, in a second category;
    classifying differential pulses having an absolute value that is less than or equal to a third predetermined threshold value, when the third predetermined threshold value is less than the second predetermined threshold value, in a third category; and
    from among the differential pulses in the first category and in second category, identifying valid differential pulses, which are pulses of opposite signs that are separated in the erroneous sequence by at least two successive differential pulses.

7. The counting method according to claim 6, wherein the valid differential pulses of the erroneous sequence of successive differential pulses are set to a predetermined differential value, and wherein the other differential pulses of the erroneous sequence of successive differential pulses are set to zero.

8. The counting method according to claim 7, wherein the predetermined differential value is positive when the valid differential pulse is positive and the predetermined differential value is negative when the valid differential pulse is negative.

9. The counting method according to claim 5, wherein the step of detecting actual turning is performed only if the wheel has a speed of rotation greater than a predetermined speed threshold.

10. The counting method according to claim 1, wherein the wheel is made of non-metallic material, the target is a metal mass, the counting method is performed by a detector device and by a counter unit connected to the detector device, the detector device comprising an inductive circuit having a coil mounted stationary facing a portion of the path followed by the target, the counter unit being adapted to transmit a voltage pulse of predetermined amplitude as input to the inductive circuit so as to generate an oscillating voltage signal as output from the inductive circuit.

11. The counting method according to claim 10, the method being performed by two detector devices, each connected to the counter unit, the step of detecting disturbance being performed by each detector device in independent manner.

12. A meter comprising a wheel and a counter device, the meter comprising:
    a target secured to the wheel;
    means arranged to generate an oscillating voltage signal representative of the presence or the absence of the target;
    means arranged to compare the amplitude of the oscillating voltage signal with a predetermined voltage threshold (Vcc/2) in order to obtain pulses; and
    means arranged to detect presence of the target or absence of the target as a function of the number of pulses obtained;
    the counting method according to claim 1 being performed in the counter device of the meter.

13. A computer program including instructions to enable a counter device of a meter to perform the counting method according to claim 1, the meter comprising a wheel and the counter device, the counter device comprising:
    a target secured to the wheel;
    means arranged to generate an oscillating voltage signal representative of the presence or the absence of the target;
    means arranged to compare the amplitude of the oscillating voltage signal with a predetermined voltage threshold (Vcc/2) in order to obtain pulses; and
    means arranged to detect presence of the target or absence of the target as a function of the number of pulses obtained.

14. A storage means, wherein that they store a computer program including instructions for enabling a counter device of a meter to perform the counting method according to claim 1.

* * * * *